(12) United States Patent
Ozono et al.

(10) Patent No.: US 6,348,234 B1
(45) Date of Patent: Feb. 19, 2002

(54) PASTE APPLYING METHOD

(75) Inventors: Mitsuru Ozono; Hitoshi Mukojima; Seiichi Sato; Nobuyuki Iwashita; Nobuyuki Suefuji, all of Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/536,614

(22) Filed: Mar. 28, 2000

(30) Foreign Application Priority Data

Mar. 31, 1999 (JP) .......................................... 11-092594
Mar. 31, 1999 (JP) .......................................... 11-092595

(51) Int. Cl.[7] .............................................. B05D 5/10
(52) U.S. Cl. .................... 427/207.1; 427/96; 427/258; 427/261; 427/269; 427/287; 427/421; 156/356
(58) Field of Search ............... 427/207.1, 96, 427/256, 258, 261, 269, 279, 286, 287, 421; 156/356

(56) References Cited

U.S. PATENT DOCUMENTS

| | | | | |
|---|---|---|---|---|
| 5,894,036 A | * | 4/1999 | Tylko | 427/279 |
| 6,086,641 A | * | 7/2000 | Shironouchi | 29/25.01 |
| 6,200,635 B1 | * | 3/2001 | Kwok | 427/286 |
| 6,206,066 B1 | * | 3/2001 | Imanishi et al. | 156/356 |

* cited by examiner

Primary Examiner—Shrive P. Beck
Assistant Examiner—Jennifer Calcagni
(74) Attorney, Agent, or Firm—McDermott, Will & Emery

(57) ABSTRACT

In a paste applying method for applying paste in an application area set on the surface of the object to be applied, the application efficiency is enhanced and the application quality is improved by applying the paste in an undulation pattern of convex and concave shape that defines the interior of the surface of the object on which no paste is deposited, where the interior area is substantially enclosed by the undulation pattern of the paste. A discharge port of an application nozzle is moved with one continuous line from an application start point to an application end point along the moving route by a plurality of passing points. The plurality of passing points are set at each corner of the application area and include a plurality of first passing points and a plurality of second passing points, where the first passing points are set at each corner of the application area and the second passing points are set at the central side of the application area.

40 Claims, 6 Drawing Sheets

PASTE APPLYING METHOD

TECHNICAL FIELD OF THE INVENTION

The present invention relates to a paste applying method for applying a bonding paste within an application area set on an object to be applied such as substrate or the like.

BACKGROUND OF THE INVENTION

In die bonding for bonding a chip on a substrate such as a lead frame, a bonding paste is applied on the substrate surface. In a paste applying method, by moving an application nozzle while discharging the paste from the application nozzle by a dispenser, it is drawn and applied in a specified application area on the substrate surface. In this method, the moving route of the application nozzle from an application start point to an application end point is set in the application area set according to the chip shape. This moving route is determined in various shapes depending on the applying pattern, and, for example, in a rectangular application area, a cross shape of moving the application nozzle in an "x"-form, or an asterisk shape of overlaying a "+"-form on the "x"-form may be employed.

In the drawing application by a conventional paste applying apparatus, however, the following problems were involved. First, such cross shape or asterisk shape is formed by combining a plurality of line segments, and the application nozzle is moved up and down every time drawing each line segment, and discharge of paste from the dispenser is started and stopped in every up-down movement. For intermittent paste discharge, it is necessary to set the response time from start-stop command to actual start-stop action of the dispenser, or an allowance time until the state after response is stabilized. Accordingly, as the number of line segments for composing the pattern is increased, the start-stop frequency of discharge is increased, and the rate of start-stop action only and not applying actually by the dispenser increases, and the entire application efficiency is lowered.

Also by frequent repetition of discharge and stop, it leads to fluctuations of application amount, defective shape of application due to stringing phenomenon of a small amount of paste drooping from the nozzle after stopping of discharge, and other problems. Further, for applying by combining multiple line segments, the application lines are overlapped in the central part of the application area, and the paste is built up high, and, as a result, the lower end of the application nozzle touches the paste, which may cause discharge failure. Thus, in the conventional paste applying method, the application efficiency was poor and it was difficult to assure the application quality.

The invention presents a paste applying apparatus and a paste applying method capable of enhancing the application efficiency and assuring the application quality.

SUMMARY OF THE INVENTION

The paste applying apparatus of the invention is a paste applying apparatus for applying paste in a rectangular application area set on the surface of the object to be applied.

The applying apparatus comprises:

an applicator having a discharge port for discharging the paste, a mover for moving the discharge-port relatively to the object, a memory unit for storing data showing positions of an application start point, a plurality of passing points, and an application end point in the application area, and a controller for controlling the mover so as to move the discharge port with one continuous line from the application start point to the application end point by way of the plurality of passing points, according to the data in the memory unit. The plurality of passing points are set at each corner of the application area.

The paste applying method of the invention for applying paste in an application area set on the surface of the object to be applied comprises:

(a) a step of supplying the object, and (b) a step of moving a discharge port of an application nozzle with one continuous line-from an application start point to an application end point along the moving route, and applying the paste on the surface of the object while discharging the paste from the discharge port. The moving route has an undulation pattern of concave and convex shape.

Preferably, the plurality of passing points include a plurality of first passing points and a plurality of second passing points, and the plurality of first passing points are set at each corner of the application area, and the plurality of second passing points are set at the central side of the application area.

Preferably, the moving route of the discharge port has such a shape that the middle point of mutually adjacent corners may be positioned at the most central side of the application area.

Preferably, at least one of the application start point and application end point is positioned on the central point of the application area.

Preferably, the application start point is positioned at a first vicinal position of the central point of the application area, and the application end point is positioned at a second vicinal position of the central point of the application area.

Preferably, the application start point and application end point are positioned near the central point of the application area.

Preferably, the undulation pattern has a convex portion positioned at each corner of the application area, and the concave portion is positioned between the convex portions.

In this configuration, the application efficiency is enhanced. The application quality is also improved.

Reference Numerals

Figure 1:
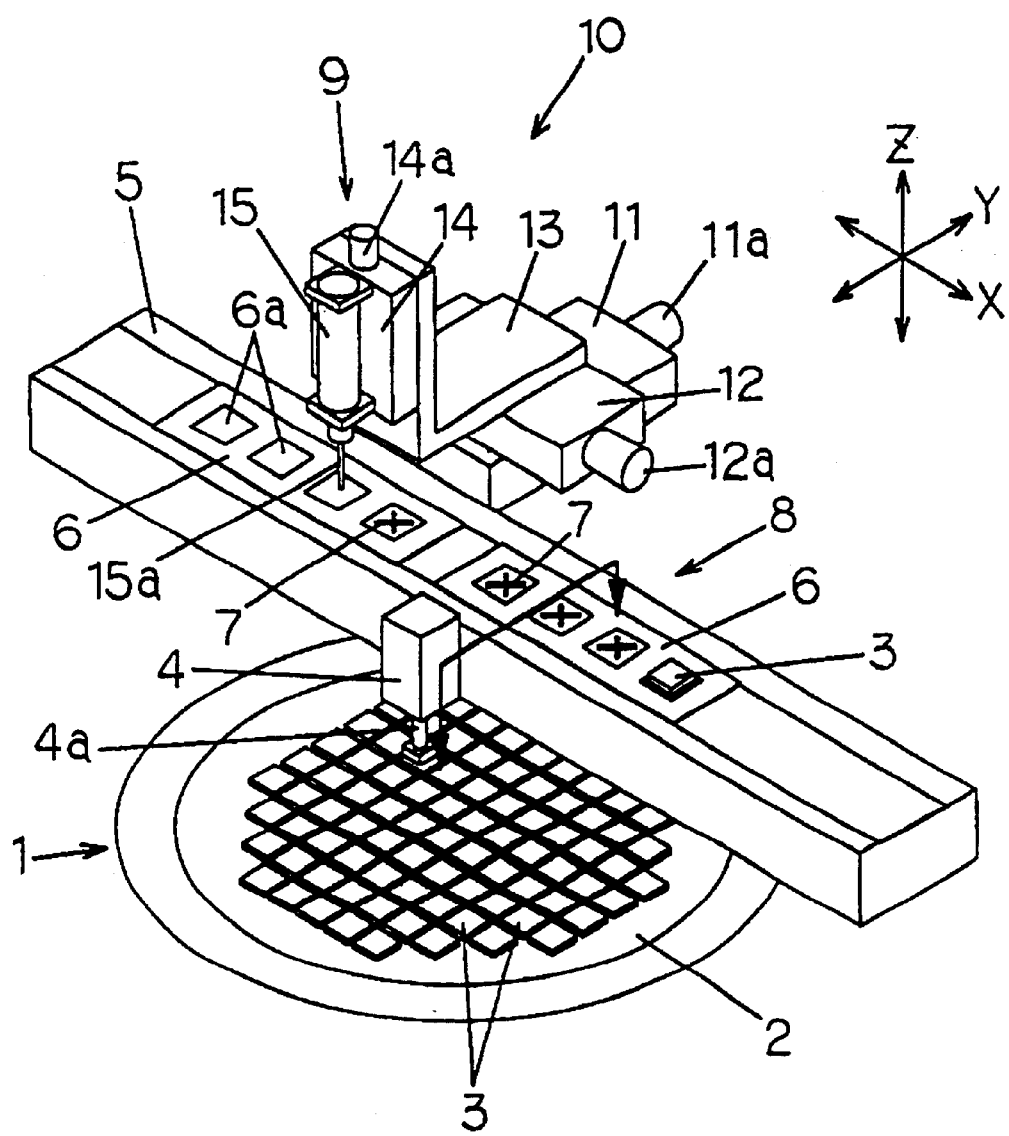
FIG. 1 is a perspective view of a die bonding apparatus in an embodiment of the invention.

6 Lead frame
6a Application area
7 Paste,
10 Moving table

15 Syringe
15a Application nozzle
22 Valve drive unit
26 Memory unit
28 Controller
C Central point
P1A, P1B, P1C, P1D First nozzle passing point
P2B, P2C, P2D Second nozzle passing point
Ps Application start point
Pe Application end point

DETAILED DESCRIPTION OF THE INVENTION

The paste applying apparatus in an embodiment of the invention is a paste applying apparatus for applying paste in an application area set on the surf ace of the object to be applied by discharging the paste from a discharge port of an application nozzle. This paste applying apparatus comprises paste discharge means for discharging, the paste from the discharge port, a mover for moving the discharge port relatively to the object, memory means for storing positions of an application start point and an application end point of the paste application, and nozzle passing points set near each corner position of the application area, and a controller for controlling the mover so as to move the discharge port with one continuous line from the application start point to the application end point by way of the nozzle passing points.

The paste applying method in an embodiment of the invention is a paste applying method for applying paste in an application area set on the surface of the object to be applied by discharging the paste from a discharge port of an application nozzle. This applying method comprises a step of drawing and applying the paste by moving the discharge port of the application nozzle with one continuous line from an application start point to an application end point along the moving route including the nozzle passing points set near each corner position of the application area. At this step, the moving route from the nozzle passing point at one corner to the nozzle passing point at next corner has such a shape as to be located at the inner side of the application area from the straight line linking the two nozzle passing points.

The paste applying apparatus in other embodiment of the invention is a paste applying apparatus for applying paste in an application area set on the surface of the object to be applied by discharging the paste from a discharge port of an application nozzle. This applying apparatus comprises paste discharge means for discharging the paste from the discharge port, a mover for moving the discharge port relatively to the object, memory means for storing positions of an application start point and an application end point of the paste application, and first nozzle passing points set near each corner position of the application area and a plurality of second nozzle passing points set at the inner side of the application area from the first nozzle passing points, and a controller for controlling the mover so as to move the discharge port with one continuous line from the application start point to the application end point by way of the nozzle passing points.

The paste applying method in other embodiment of the invention is a paste applying method for applying paste in an application area set on the surface of the object to be applied by discharging the paste from a discharge port of an application nozzle. By setting first nozzle passing points near each corner position of the application area and second nozzle passing points at the inner side of the application area from the first nozzle passing points, these passing points are stored in the memory means, and the discharge port of the nozzle is moved with one continuous line from the application start point to the application end point by way of the first nozzle passing points and second nozzle passing points along the moving route. Thereby, the paste is applied by drawing.

In this constitution, by moving with one continuous line from the application. start point through the nozzle passing points set near the corners of the application area till the application end point along the moving route getting at the inner side of the application area, it can prevent drop of application efficiency due to start and stop of discharge, fluctuations of application amount, and defective application shape.

Preferably, the positions of application start. point and application end point are set properly with respect to the central point of the application area. In this constitution, sticking of paste to the nozzle end is prevented. Preferably, aside from drawing application, the paste is additionally applied in the center of the application area. In this constitution, the total application amount can be adjusted.

Figure 2:
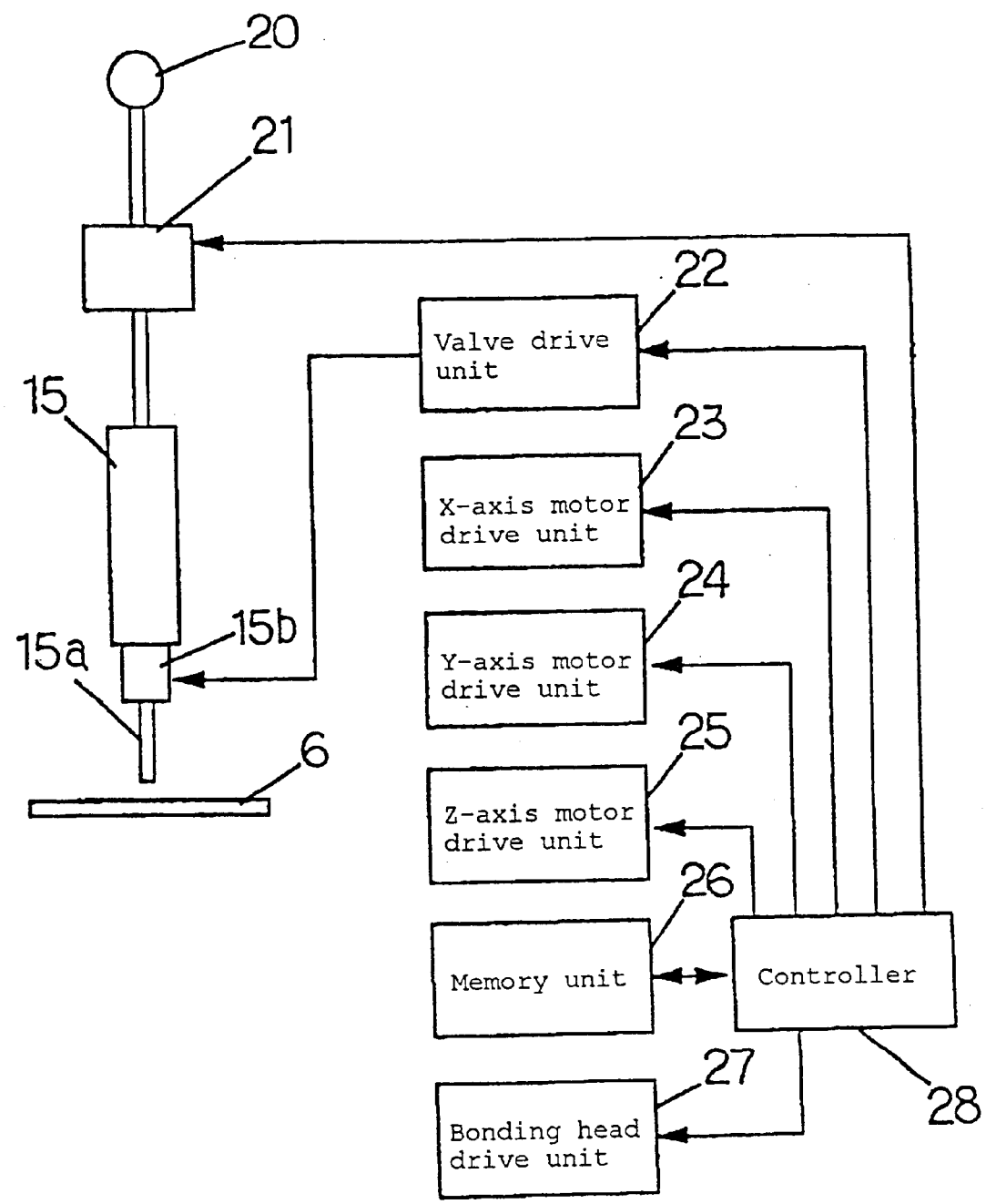
FIG. 2 is a block diagram showing a configuration of control system of the die bonding apparatus in the embodiment of the invention.
Figure 3:
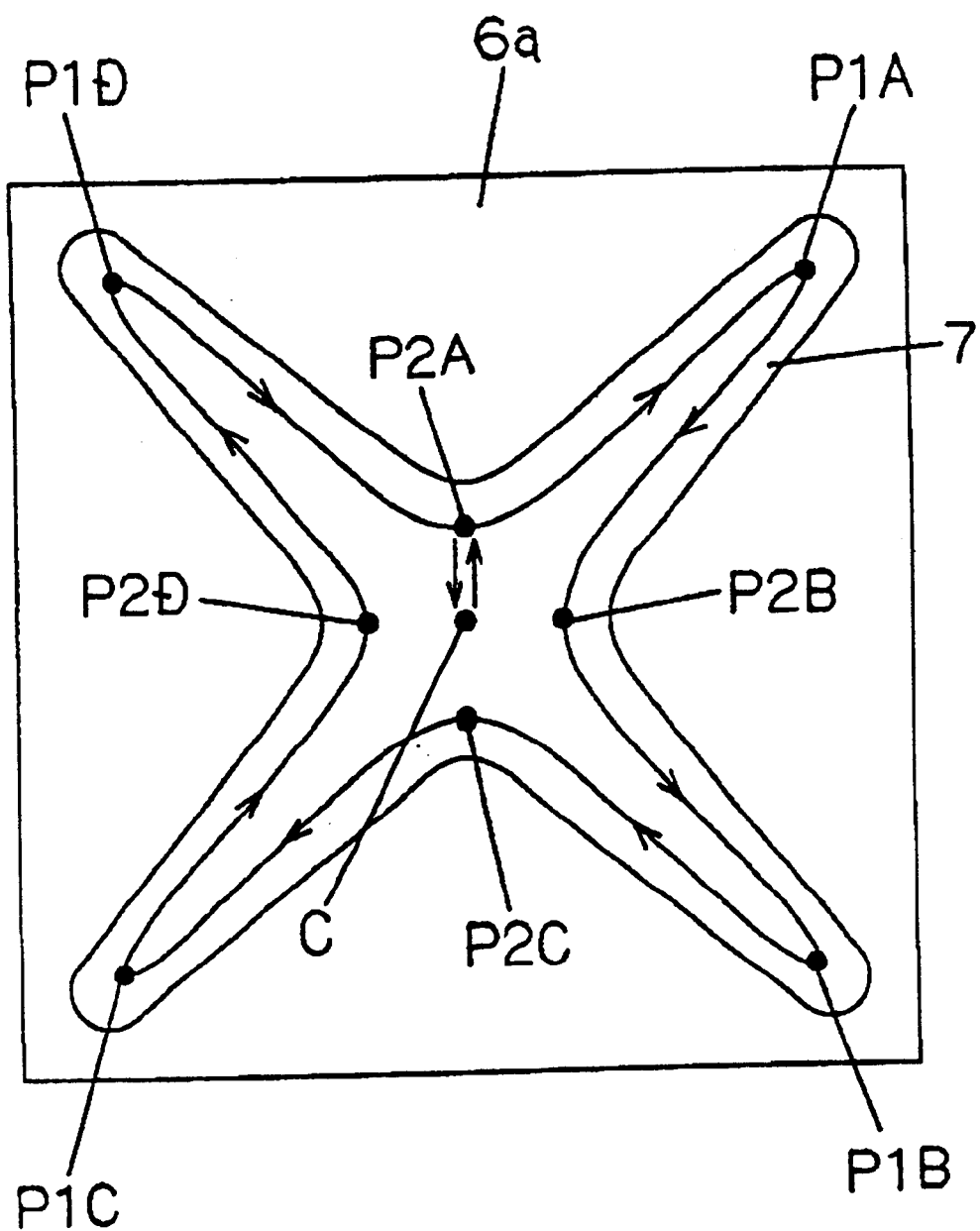
FIG. 3 is an explanatory diagram of paste application pattern in the embodiment of the invention.
Figure 4:
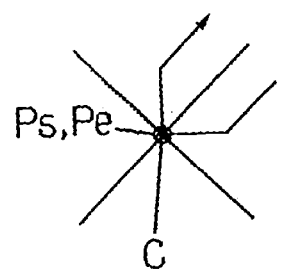
FIG. 4(A) to FIG. 4(E) are explanatory diagrams of paste application sequence in other embodiment of the invention.
Figure 4:
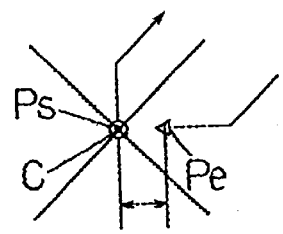
Figure 4:
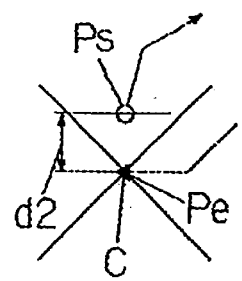
Figure 4:
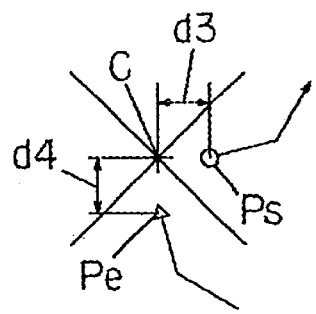
Figure 4:
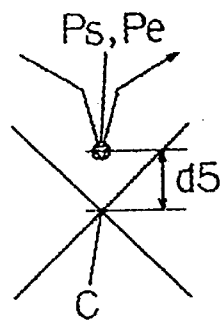
Figure 5:
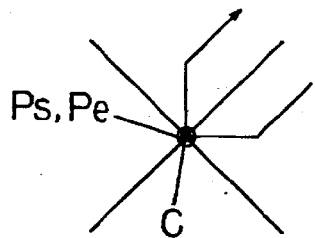
FIG. 5(A) to FIG. 5(G) are explanatory diagrams of paste application sequence in a different embodiment of the invention.
Figure 5:
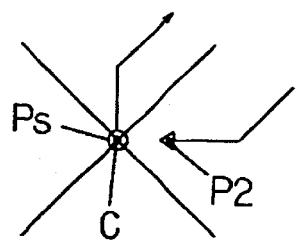
Figure 5:
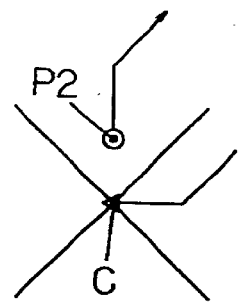
Figure 5:
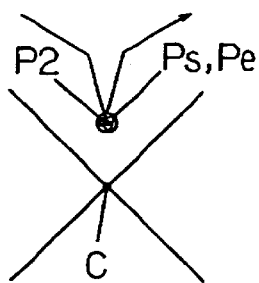
Figure 5:
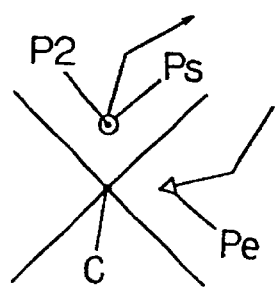
Figure 5:
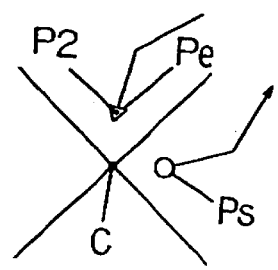
Figure 5:
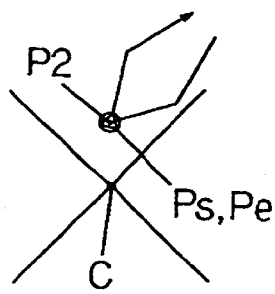

Exemplary embodiments of the invention are described below while referring to the drawings. FIG. 1 is a perspective view of a die bonding apparatus in an embodiment of the invention, FIG. 2 is a block diagram showing a configuration of control system of the die bonding apparatus, FIG. 3 is an explanatory diagram of the paste application pattern, FIG. 4 is an explanatory diagram of the paste application sequence, and FIG. 5 is an explanatory diagram of the drawing pattern.

Referring first to FIG. 1, the structure of the die bonding apparatus is described. In FIG. 1, a wafer sheet 2 is held by a holding table (not shown) in a chip feeder 1. Multiple chips 3, that is, semiconductors are adhered on the wafer sheet 2. At a side of the chip feeder 1, a conveying path 5 is disposed. The conveying path 5 conveys a lead frame 6, and positions the lead frame 6 at a paste application position and a bonding position. A bonding head 4 is disposed above the chip feeder 1. The bonding head 4 moves horizontally and vertically by means of a moving mechanism (not shown).

At a side of the conveying path 5, a paste applicator 9 is disposed. The paste applicator 9 includes a moving table 10 as the mover, and a syringe 15 of the dispenser mounted on the moving table 10. The syringe 15 has an application nozzle 15a. The moving tables includes an X-axis table 12 stacked up on a Y-axis table 11, and a Z-axis table 14 coupled thereon vertically through an L-bracket 13. The Y-axis table 11, X-axis table 12, and Z-axis table 14 respectively have a Y-axis motor 11a, an X-axis motor 12a, and a Z-axis motor 14a.

By driving the X-axis motor 12a, Y-axis motor lha and Z-axis motor 14a, the syringe 15 is moved in the horizontal direction and vertical direction above the lead frame 6. The syringe 15 is filled with paste 7 for adhering the chips 3 to the lead frame 6. With the syringe 15 compressed with an air pressure, when the valve 15b (see FIG. 2) of the application nozzle 15a is opened, the paste is discharged from the discharge port of the application nozzle 15a.

The chip bonding position 6a for bonding the chips 3 on the lead frame 6 is the application area 6a for applying the paste. By positioning the discharge port of the application nozzle 15a inside of the application area 6a, and moving the application nozzle 15a while discharging the paste from the application nozzle 15a, the paste 7 is applied in the application area 6a set on the surface of the lead frame 6 which is the object to be applied, in an "x"-form application pattern. Air pressure feeding means for providing the syringe 15, application nozzle 15a and syringe 15 is the paste discharge means. The moving table 10 is the mover for moving the discharge port of the application nozzle 15a.

After this paste application, the lead frame 6 is sent to the bonding position 8 on the conveying path 5, and is positioned. On the paste 7 applied in the application area 6a, the chips 3 being picked up from the chip feeder 1 are bonded by the nozzle 4a of the bonding head 4.

Referring next to FIG. 2, the control system of the die bonding apparatus is described. In FIG. 2, the air supplied from an air source 20 is fed into the syringe 15 through a regulator 21. The regulator 21 is remote-control means for setting the pressure. By controlling the regulator 21 by a controller 28, the pressure of the air supplied into the syringe 15 is adjusted, and the discharge amount of the paste discharged from the application nozzle 15a can be controlled. A valve drive unit 22 drives the valve 15b for opening or closing the application nozzle 15a. By controlling the valve drive unit 22 by the controller 28, the paste discharge from the application nozzle 15a can be started and stopped. Meanwhile, instead of controlling the set pressure of the regulator 21 by the controller 28, the pressure may be set by manual operation, and a specified discharge amount may be obtained.

An X-axis motor drive unit 23, a Y-axis motor drive unit 24, and a Z-axis motor drive unit 25 respectively drive the X-axis motor 12a, Y-axis motor 11a, and Z-axis motor 14a of the moving table 10. By controlling the X-axis motor drive unit 23, Y-axis motor drive unit 24, and Z-axis motor drive unit 25 by the controller 28 which is control means, the operation of the moving table 10 is controlled.

In a memory unit 26, various data are stored, such as data about applying operation of the application nozzle 15a (that is, application start point and application end point set in the application area), data of positions of nozzle passing points during application operation, and moving speed pattern and paste discharge amount of the application nozzle 15. That is, the memory unit 26 is memory means. On the basis of the data stored in the memory means 26, the controller 28 controls the moving operation of the application nozzle 15a driven by the moving. table 10, and discharge operation of the paste from the nozzle 15a of the syringe 15, so that the paste can be applied in a specified drawing pattern in the application area 6a. The bonding head drive unit 27 is controlled by the controller 28, and drives the bonding head 4.

The drawing pattern and the nozzle passing points for obtaining the drawing pattern are explained below by referring to FIG. 3. In FIG. 3, the application area 6a indicated by a square frame shows the range of application of paste prior to mounting of the chips 3. Point C is the central point (center of gravity in the area) of the application area 6a, and this central point C is set at the application start point and application end point by the nozzle 15a in the drawing pattern.

In the application area 6a, the passing point of the nozzle 15a is set as the moving track, aside from the application start point and application end point in the drawing application. The moving track has a convex and concave shape. Near the four corner positions of the application area 6a, first nozzle passing points P1A, P1B, P1C, and P1D are set. Inside of the first nozzle passing points P1A, P1B, P1C, and P1D in the application area 6c, second nozzle passing points P2A, P2B, P2C, and P2D are. set. The first nozzle passing points P1A, P1B, P1C, and P1D, and the second nozzle passing points P2A, P2B, P2C, and P2D are disposed at symmetrical positions with respect to the central point C. The data of these nozzle passing points are stored in the memory unit 26.

This bonding apparatus is composed as described above. The operation of the bonding apparatus is described below. In FIG. 1, the lead frame 6 is conveyed on the conveying path 5, and is positioned underneath the paste applicator 9. Then, driving the moving table 10, the application nozzle 15a of the syringe 15 is positioned on the application area 6a of the lead frame 6, and drawing application is executed. In drawing application, the moving track of the nozzle is determined according to the following basic rules.

(1) Application start and application end are set at either the center of the application area or a second nozzle passing point.

(2) When moving from a first nozzle passing point to a next first nozzle passing point, the nozzle must pass over a second nozzle passing point at least once.

(3) In principle, the nozzle passes each nozzle passing point only once.

(4) The nozzle moving tracks should not intersect.

As the exception of item (3) above, the application end point is-set on the center of the application area, or the application start point and application end point are set on a same second nozzle passing point. In the former case, at one position, the nozzle passing a same second nozzle passing point twice. In the latter case, the nozzle does not pass the second nozzle passing point set at the application start point and application end point.

An exemplary embodiment of drawing application is explained below. First, the application nozzle 15a is moved onto the central point C shown in FIG. 3, and the height from the application surface of the lower end of the nozzle 15a is positioned to a specified height suited to application. While keeping this height, discharge of the paste 7 is started, and the application nozzle 15a is moved in a specified route. The application nozzle 15a reaches the second nozzle passing point P2A from the central point C, and moves to the outer side toward the first nozzle passing point P1A. At the first nozzle passing point P1A, the application nozzle 15a is inverted to the inner side, and passes the second nozzle passing point P2B from the first nozzle passing point P1A, and reaches again the first nozzle passing point P1B near the corner. That is, the moving route of the application nozzle 15a from the nozzle passing point at one corner to the nozzle passing point at next corner is in a shape of getting in to the inner side of the application area 6a from the straight line linking the two nozzle passing points (first nozzle passing points P1A, P1B), and further the moving route is in a shape of getting into the most central side of the application area 6a of the middle point of the two nozzle passing points (first nozzle passing-points P1A, P1B)

Later, the application nozzle 15a follows the same moving route, sequentially passing through the second nozzle passing point P2C, first nozzle passing point P1C, second nozzle passing point P2D, and first nozzle passing point P1D, and returns to the second nozzle passing point P2A. Finally, when the application nozzle 15a reaches the central point C as the application end point, paste discharge from the nozzle 15a is terminated, and the application nozzle 15a is raised, and drawing application in one application area 6a is over. That is, in this drawing application, the application nozzle 15a moves with one continuous line, without interrupting the application on the way, by lowering the application nozzle 15a at the application start point of central point C, until returning to the application end point at the central point by way of the specified moving route.

In this embodiment, the application start point and application end point are set at the central point C in the application area 6a, but in other exemplary embodiments, for example, the application start point and application end point may be set at different positions as shown in FIG. 4(A) to FIG. 4(E). In FIG. 4(A), the application start point Ps and application end point Pe are both set at the central point C, in FIG. 4(B), the application start point Ps is set at the central point, and the application end point Pe is set at an offset point d1 from the central point C, and in FIG. 4(C), the application end point Pe is set at the central point, and the application start point Ps is set at an offset point d2 from the central point C. That is, in FIG. 4(A), FIG. 4(B), and FIG. 4(C), the application start point Ps and/or the application end point Pe is set at the central point C.

In FIG. 4(D), both the application start point Ps and the application end point Pe are set at offset points d3, d4 from the central point C. In FIG. 4(E), both the application start point Ps and the application end point Pe are set at same offset point d5 from the central point C.

In a further different exemplary embodiment, the application start point and application end point may be set at different positions as shown in FIG. 5(A) to FIG. 5(G). In FIG. 5(A), the application start point Ps and application end point Pe are both set at the central point C, in FIG. 5(B), the application start point Ps is set at the central point, and the application end point Pe is set at second nozzle passing point P2, and in FIG. 5(C), the application end point Pe is set at the central point, and the application start point Ps is set at second nozzle passing point P2. That is, in FIG. 5(A), FIG. 5(B), and FIG. 5(C), the application start point Ps and/or the application end point Pe is set at the central point C. This is same as in FIG. 4(A), FIG. 4(B), and FIG. 4(C).

In FIG. 5(D), FIG. 5(E), and FIG. 5(F), the application start point Ps and/or the application end point Pe is set at second nozzle passing point P2. Herein, the application end point Pe in FIG. 5(E) and application start point Ps in FIG. 5(F) may be selected at any arbitrary point other than the central point C and second nozzle passing point P2. In FIG. 5(G), the application start point Ps and the application end point Pe are set at same second nozzle passing point.

By thus setting the positions of the application start point Ps and the application end point Pe in various patterns, the following problems experienced in the conventional drawing application can be solved. That is, depending on the drawing pattern, the moving route of the application nozzle 15a is overlapped on the central point in the application area, and the paste is applied repeatedly in a same range, and as a result of such repeated application, the application height at the central point C becomes excessive. As the lower end of the application nozzle 15a touches the paste, the nozzle clogging or other problem may likely to occur. In such a case, by selecting a proper setting of application start point and application end point from various patterns in FIG. 4 and FIG. 5, concentrated application of past in a specific range can be prevented.

The moving route of the discharge port or application nozzle 15a has a symmetrical pattern on both sides of the central point of the moving route. Or the moving route has an undulation pattern having concave and convex shape.

Figure 6:
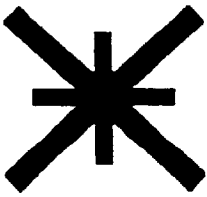
FIG. 6(A) to FIG. 6(D) are explanatory diagrams of drawing patterns in other different embodiment of the invention.
Figure 6:
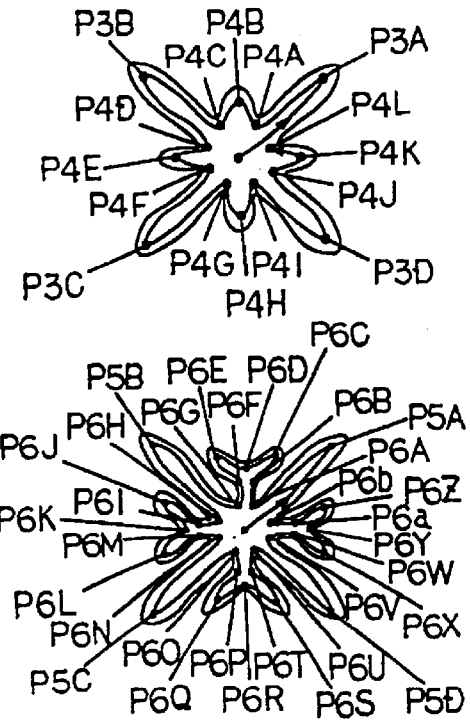
Figure 6:
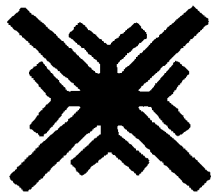
Figure 6:
Figure 6:
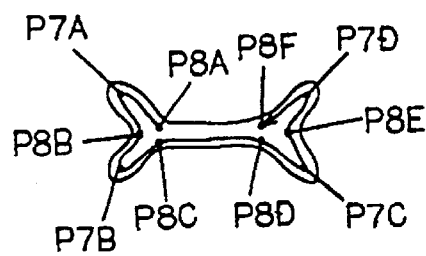
Figure 6:
Figure 6:
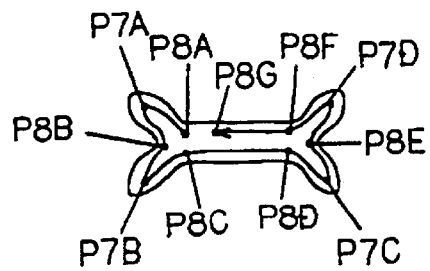

FIG. 6(A) to FIG. 6(D) show examples of moving route having concave and convex shape other than cross shape shown above. FIG. 6(A) shows an asterisk form, which is a pattern increased in the application amount in the central area by combining "x"-form and "+"-form. In the diagram, points P3A to P3D are first nozzle passing points, and P4A to P4L are second nozzle passing points. FIG. 6(B) shows a snow crystal form, which is further increased in the application amount than the asterisk form. In the diagram, points P5A to P5D are first nozzle passing points, and P6A to P6Z, P6a, P6b are second nozzle passing points. The snow crystal form is effective when bonding a large chip, that is, in the case of a wide application area. FIG. 6(C) shows a double-Y form used in a rectangular application area, and FIG. 6(D) is a pattern increased in the application amount in the central part of the double-Y form. In the diagram, points P7A to P7D are first nozzle passing points, and P8A to P8G are second nozzle passing points.

All these patterns are designed to draw and apply by moving with one continuous line without interrupting drawing by the application nozzle as shown in the attached nozzle route patterns, and the moving route of the application nozzle from the nozzle passing point at one corner to the nozzle passing point at next corner is shaped so as to get to the inner side of the application area from the straight line linking the nozzle passing points at two corners.

By using such drawing application pattern, the following effects are obtained. First of all, by moving with one continuous line, it is not necessary to move up or down the nozzle when moving to next application line, and hence the nozzle can be moved at high speed. Since the paste is discharged continuously, it does not involve any loss time such as response time and stabilization time as required in intermittent discharge operation. Moreover, it is free from fluctuations of application amount caused by intermittent discharge operation, or defective shape of application due to stringing of paste from the nozzle end. Thus, according to this application pattern, the application efficiency is enhanced and the paste can be applied at a stable application quality.

The foregoing embodiments relate to examples of applying paste by drawing application only within the moving stroke from application start point till application end point, but not limited to them, aside from the drawing application, the paste may be additionally applied in the central portion of the application area before start of move of the application nozzle 15a, or after finishing the move. As a result, if the entire application amount is not assured by the drawing application alone, the total application amount can be adjusted by stable discharge in the stopped state of the application nozzle, so that the application amount can be controlled at a high precision.

As described herein, the discharge port of the application nozzle is moved with one continuous line from the application start point to the application end point along the moving route passing through the nozzle passing points set near the corner position of the application area and getting to the inner side of the application area. Accordingly, it avoids drop of application efficiency due to intermittent discharge operation, fluctuation of application amount, or defective shape of application. By setting the positions of application start point and application end point appropriately with respect to the central point of the application area, sticking of paste to the nozzle end can be prevented. Moreover, aside from the drawing application, by applying the paste additionally in the central portion of the application area, the total application amount can be adjusted.

What is claimed is:

1. A paste applying method for applying paste in an application area set on a surface of an object comprising the steps of:

(a) supplying the object, and (b) moving a discharge port of an application nozzle with one continuous line from an application start point to an application end point along a moving route, and applying the paste on the surface of the object while discharging the paste from the discharge port, the moving route having an undulation pattern of concave and convex shape, wherein the undulation pattern defines an interior area of the surface of the object on which no paste is deposited, said interior area being substantially enclosed by said undulation pattern of said paste.

2. The paste applying method of claim 1, further comprising the steps of:

(c) storing at least one point of the points set in the moving route in a memory unit, wherein said application nozzle is moved while, being controlled by said memory unit, and the paste is applied on the surface of the object.

3. The paste applying method of claim 1, wherein said undulation pattern has a plurality of convex portions and a plurality of concave portions, each convex portion of said plurality of convex portions is positioned at mutually symmetrical positions on both sides of the central point of the undulation pattern, and each concave portion of said plurality of concave portions is positioned at mutually symmetrical positions on both sides of the central point of the undulation pattern.

4. The paste applying method of claim 1, wherein at least one of the application start point and application end point is positioned on the central point of the application area.

5. The paste applying method of claim 1, wherein the application start point is positioned at a first vicinal position of the central point of the application area, the application end point is positioned at a second vicinal position of the central point of the application area, and said first vicinal position and second vicinal position are mutually different positions.

6. The paste applying method of claim 1, wherein said undulation pattern has a plurality of convex portions and a plurality of concave portions, and at least one of said application start point and application end point is positioned at one of said plurality of concave portions.

7. The paste applying method of claim 1, wherein said application area has a rectangular shape with a plurality of corners, said undulation pattern has a plurality of convex portions. and a plurality of concave portions, and at least one convex portion of said plurality of convex portions is positioned at each corner of said plurality of corners.

8. The paste applying method of claim 1, wherein said application starting point and said application end point are positioned about a central point or near the central point of the application area.

9. The paste applying method of claim 1, wherein when moving from one corner to an adjacent corner the undulation pattern passes outside of at least two first passing points and passes inside of at least one second passing point, wherein the second passing point is disposed between a line defined by the two first passing points and the center line of the object.

10. The paste applying method of claim 1, wherein said undulation pattern has a radial pattern that no deposited paste area opens from a center of the application area to outer area of the undulation pattern.

11. A paste applying method for applying paste in an application area set on a surface of an object comprising:

a step of moving a discharge port of an application nozzle with one continuous line from an application start point to an application end point along the moving route by way of a plurality of passing points set near a plurality of corners of said application area, and applying the paste on the surface of the object while discharging the paste from said discharge port, wherein said plurality of corners have a first corner and a second corner, and the moving route from the first passing point near the first corner to the first passing point near the second corner has such a shape as to get into the inner side of the application area from the straight line linking the first passing point near the first corner and first passing point near the second corner, said moving route has an undulation pattern of concave and convex shape, and the undulation pattern defines an interior area of the surface of the object on which no paste is deposited, said interior area being substantially enclosed by said undulation pattern of said paste.

12. The paste applying method of claim 11, wherein at least one of the application start point and application end point is positioned on the central point of the application area.

13. The paste applying method of claim 11, wherein the application start point is positioned at a first vicinal position of the central point of the application area, and the application end point is positioned at a second vicinal position of the central point of the application area.

14. The paste applying method of claim 11, wherein the application start point and application end point are positioned near the central point of the application area.

15. The paste applying method of claim 11, further comprising a step of applying the paste in the central portion of the application area.

16. The paste applying method of claim 11, wherein said application starting point and said application end point are positioned about a central point or near the central point of the application area.

17. The paste applying method of claim 11, wherein when moving from one corner to an adjacent corner the undulation pattern passes outside of at least two first passing points and passes inside of at least one second passing point, wherein the second passing point is disposed between a line defined by the two first passing points and the center line of the object.

18. The paste applying method of claim 11, wherein said undulation pattern has a radial pattern that no deposited paste area opens from a center of the application area to outer area of the undulation pattern.

19. A paste applying method for applying paste in an application area set on a surface of an object comprising the steps of:

(a) storing an application start point, a first passing point positioned near a plurality of corners of the application area, a second passing point positioned at the inner side of the straight line linking mutually adjacent corners, and an application end point, in a memory unit, and (b) moving a discharge port of an application nozzle with one continuous line from the application start point to the application end point along a moving route by way of the first passing point and second passing point, as being controlled by said memory unit, and applying the paste on the surface of the object while discharging the paste from the discharge port, wherein said moving route has an undulation pattern of concave and convex shape, and the undulation pattern defines an interior area of the surface of the object on which no paste is deposited, said interior area being substantially enclosed by said undulation pattern of said paste.

20. The paste applying method of claim 19, wherein said first passing point has a plurality of first passing points, said second passing point has a plurality of second passing points, each first passing point of said plurality of first passing points is set at mutually symmetrical positions on both sides of the central point of the application area, and.

each second passing point of said plurality of second passing points is set at mutually symmetrical positions on both sides of the central point of the application area.

21. The paste applying method of claim 19, wherein at least one of the application start point and application end point is positioned on the central point of the application area.

22. The paste applying method of claim 19, wherein at least one of the application start point and application end point is positioned on the second passing point.

23. The paste applying method of claim 19, wherein both the application start point and application end point are positioned on the second passing point.

24. The paste applying method of claim 19, further comprising the step of:

(c) applying the paste in the central portion of the application area.

25. The paste applying method of claim 19, wherein said application starting point and said application end point are positioned about a central point or near the central point of the application area.

26. The paste applying method of claim 19, wherein when moving from one corner to an adjacent corner the undulation pattern passes outside of at least two first passing points and passes inside of at least one second passing point, wherein the second passing point is disposed between a line defined by the two first passing points and the center line of the object.

27. The paste applying method of claim 19, wherein said undulation pattern has a radial pattern that no deposited paste area opens from a center of the application area to outer area of the undulation pattern.

28. A paste applying method for applying paste in an application area set on a surface of an object comprising the steps of:

(a) supplying the object, and (b) moving a discharge port of an application nozzle with one continuous line from an application start point to an application end point along a moving route, and applying the paste on the surface of the object while discharging the paste from the discharge port, the moving route having an undulation pattern of concave and convex shape, wherein when moving from one corner to an adjacent corner the undulation pattern passes outside of at least two first passing points and passes inside of at least one second passing point, wherein the second passing point is disposed between a line defined by the two first passing points and the center line of the object.

29. The paste applying method of claim 28, wherein at least one of said application starting point and said application end point is positioned about a central point or near the central point of the application area.

30. The paste applying method of claim 28, wherein said undulation pattern defines an interior area of the surface of the object on which no paste is deposited, said interior area being substantially enclosed by said undulation pattern of said paste.

31. The paste applying method of claim 28, wherein said undulation pattern has a radial pattern that no deposited paste area opens from a center of the application area to outer area of the undulation pattern.

32. A paste applying method for applying paste in an application area set on a surface of an object comprising:

a step of moving a discharge port of an application nozzle with one continuous line from an application start point to an application end point along the moving route by way of a plurality of passing points set near a plurality of corners of said application area, and applying the paste on the surface of the object while discharging the paste from said discharge port, wherein said moving route has an undulation pattern of concave and convex shape, and when moving from one corner to an adjacent corner the undulation pattern passes outside of at least two first passing points and passes inside of at least one second passing point, wherein the second passing point is disposed between a line defined by the two first passing points and the center line of the object.

33. The paste applying method of claim 32, wherein at least one of said application starting point and said application end point is positioned about a central point or near the central point of the application area.

34. The paste applying method of claim 32, wherein said undulation pattern defines an interior area of the surface of the object on which no paste is deposited, said interior area being substantially enclosed by said undulation pattern of said paste.

35. The paste applying method of claim 32, wherein said plurality of corners have a first corner and a second corner, and the moving route from the first passing point near the first corner to the first passing point near the second corner has such a shape as to get into the inner side of the application area from the straight line linking the first passing point near the first corner and first passing point near the second corner.

36. The paste applying method of claim 32, wherein said undulation pattern has a radial pattern that no deposited paste area opens from a center of the application area to outer area of the undulation pattern.

37. A paste applying method for applying paste in an application area set on a surface of an object comprising the steps of:

(a) storing an application start point, a first passing point positioned near a plurality of corners of the application area, a second passing point positioned at the inner side of the straight line linking mutually adjacent corners, and an application end point, in a memory unit, and (b) moving a discharge port of an application nozzle with one continuous line from the application start point to the application end point along a moving route by way of the first passing point and second passing point, as being controlled by said memory unit, and applying the paste on the surface of the object while discharging the paste from the discharge port, wherein said moving route has an undulation pattern of concave and convex shape, and when moving from one corner to an adjacent corner the undulation pattern passes outside of at least two first passing points and passes inside of at least one second passing point, wherein the second passing point is disposed between a line defined by the two first passing points and the center line of the object.

38. The paste applying method of claim 37, wherein at least one of said application starting point and said application end point is positioned about a central point or near the central point of the application area.

39. The paste applying method of claim 37, wherein said undulation pattern defines an interior area of the surface of the object on which no paste is deposited, said interior area being substantially enclosed by said undulation pattern of said paste.

40. The paste applying method of claim 37, wherein said undulation pattern has a radial pattern that no deposited paste area opens from a center of the application area to outer area of the undulation pattern.

* * * * *